(12) United States Patent
Kim et al.

(10) Patent No.: US 9,118,301 B2
(45) Date of Patent: Aug. 25, 2015

(54) BONDING WIRE IMPEDANCE MATCHING CIRCUIT

(71) Applicant: KOREA ELECTRONICS TECHNOLOGY INSTITUTE, Seongnam-si, Gyeonggi-do (KR)

(72) Inventors: Ki Jin Kim, Gwangju-si (KR); Kwang Ho Ahn, Yongin-si (KR); Sang Hoon Park, Seoul (KR); Jong Won Yu, Daejeon (KR); Hyung Sung Tae, Daejeon (KR)

(73) Assignee: KOREA ELECTRONICS TECHNOLOGY INSTITUTE, Seongnam-Si, Gyeonggi-Do (KR)

( * ) Notice: Subject to any disclaimer, the term of this patent is extended or adjusted under 35 U.S.C. 154(b) by 317 days.

(21) Appl. No.: 13/716,406

(22) Filed: Dec. 17, 2012

(65) Prior Publication Data
US 2013/0154760 A1 Jun. 20, 2013

(30) Foreign Application Priority Data
Dec. 15, 2011 (KR) .................. 10-2011-0135236

(51) Int. Cl.
*H03H 7/38* (2006.01)
*H01P 5/02* (2006.01)

(52) U.S. Cl.
CPC . *H03H 7/38* (2013.01); *H01P 5/028* (2013.01)

(58) Field of Classification Search
CPC ........................................... H03H 7/38
USPC ................................. 333/32, 33, 185
See application file for complete search history.

(56) References Cited

U.S. PATENT DOCUMENTS

2012/0019334 A1\* 1/2012 Hirai et al. ................... 333/32

FOREIGN PATENT DOCUMENTS

| KR | 100812066 | 11/2007 |
| KR | 1020080052138 | 6/2008 |

\* cited by examiner

*Primary Examiner* — Stephen E Jones
(74) *Attorney, Agent, or Firm* — Lowe Hauptman & Ham, LLP

(57) ABSTRACT

An impedance matching circuit is provided. The present impedance matching circuit is able to match impedance using a transformer which is arranged inside a dielectric substrate and arranged to overlap with a bonding pad area and an end of a transmission line, thereby enabling transmitting signals at a desired frequency with a minimum insertion loss without using a very thin transmission line which is several to dozens of μm wide or specially designed antennas in order to compensate for inductance. Thus, the present impedance matching circuit may be applied to various millimeter bands.

7 Claims, 3 Drawing Sheets

# BONDING WIRE IMPEDANCE MATCHING CIRCUIT

CROSS REFERENCE TO RELATED APPLICATION

This application claims the priority of Korean Patent Application No. 10-2011-0135236, filed on Dec. 15, 2011 in the KIPO (Korean Intellectual Property Office), which is incorporated herein by reference in its entirety.

BACKGROUND OF THE INVENTION

1. Field of the Invention

Methods and apparatuses consistent with the exemplary embodiments relate to an impedance matching circuit, and more particularly, to a bonding wire impedance matching circuit which matches impedance in a case where bonding wire is connected with another circuit.

2. Background Art

In millimeter bands, since wavelengths are very short, severe transmission loss may occur even by a small mismatched condition. Especially, bonding wire used between various chips such as transceivers etc. cause severe transmission loss. This is transmission loss due to an impedance mismatch caused by an inductance component of bonding wire which is relatively big in proportion to the wavelength of millimeter frequency broadband, which must be compensated by an impedance matching method to prevent performance degradation.

In a case of an existing millimeter band matching method, most of the designing were made using LC transmission lines. However, embodying such methods require very thin transmission lines of several to dozens of μm, which is difficult to embody in an actual passive environment.

The conventional matching methods using general LC transmission lines is the most widely used method in impedance compensation circuits regarding bonding wire. However, if the bonding wire becomes longer to hundreds of μm, the impedance (Lp) required in the actual impedance compensation circuit becomes greater, which means that very thin transmission lines of several to dozens of μm must be used. This means makes embodying transmission lines very difficult, considering the line width limitations (50 μm) in an actual LTCC process.

In order to compensate this problem, researches have been conducted to design impedance of antennas to match the impedance of bonding wire. However, a problem with this method is that it is difficult to apply to cases where the circuits behind chips are transmission lines and not antennas.

More specifically, researches have been made for methods of compensating chip compensation circuits with input impedance of passive devices such as antennas. This is a method of compensating the inductance of bonding-wire through the input impedance of antennas when designing the antennas, and since it can minimize the matching circuit and thereby minimize the RF system, this method is widely applied to integrations between antennas and chips. However, a problem with this method is that it is difficult to apply to cases where, on circuits behind chips, chips or other transmission lines are arranged instead of antennas.

As such, conventional impedance matching methods have problems. Accordingly, there is a need to seek a bonding wire impedance matching method applicable to various millimeter bands.

SUMMARY OF THE INVENTION

The present disclosure has been presented to resolve the aforementioned problems, and the purpose of the present disclosure is to provide an impedance matching circuit which matches impedance using a transformer which is arranged inside a dielectric substrate, and is arranged to overlap with a bonding pad area and an end area of a transmission line.

According to an exemplary embodiment of the present disclosure, there is provided an impedance matching circuit which includes a dielectric substrate; a ground arranged on a lower surface of the dielectric substrate; a first pad which is arranged on an upper surface of the dielectric substrate, and to which bonding wires is connected; a transmission line which is arranged on an upper surface of the dielectric substrate, and of which an end is arranged by a certain distance from the first pad; and a second pad which is arranged inside the dielectric substrate, and is arranged to overlap with the first pad area and one end area of the transmission line.

In addition, the second pad may be $\lambda_g/4$ transformer $\lambda_g$ being a wavelength of a transmission signal).

Furthermore, a distance between the first pad area and the one end area of the transmission line may be $\lambda_g/4$, and the area of the second pad overlapping with the first pad area and the one end of the transmission line may be $\lambda_g/4$ long.

In addition, the second pad may have a square pad shape of a length of $\lambda_g/4$.

Furthermore, the transmission line may be a micro-strip line, and may have a line width of 50 μm or more.

In addition, the second pad may generate a series capacitance component with the first pad, generate a parallel capacitance component with the ground, and generate a series capacitance component with an end of the transmission line.

Furthermore, the first pad, second pad, and one end of the transmission line may form an LC resonation circuit.

In addition, the impedance matching circuit may be produced on a substrate using an LTCC (Low-Temperature Confired Ceramic) method.

According to various exemplary embodiments of the present disclosure, it becomes possible to provide an impedance matching circuit which matches impedance using a transformer which is arranged inside a dielectric substrate, and is arranged to overlap with a bonding pad area and an end area of a transmission line, thereby enabling transmitting signals at a desired frequency with a minimum insertion loss without using a very thin transmission line which is several to dozens of μm wide or specially designed antennas in order to compensate for inductance. Thus, the present impedance matching circuit may be applied to various millimeter bands.

BRIEF DESCRIPTION OF THE DRAWINGS

The above and/or other aspects of the present disclosure will be more apparent by describing certain present disclosure with reference to the accompanying drawings, in which.

DETAILED DESCRIPTION

Figure 1:
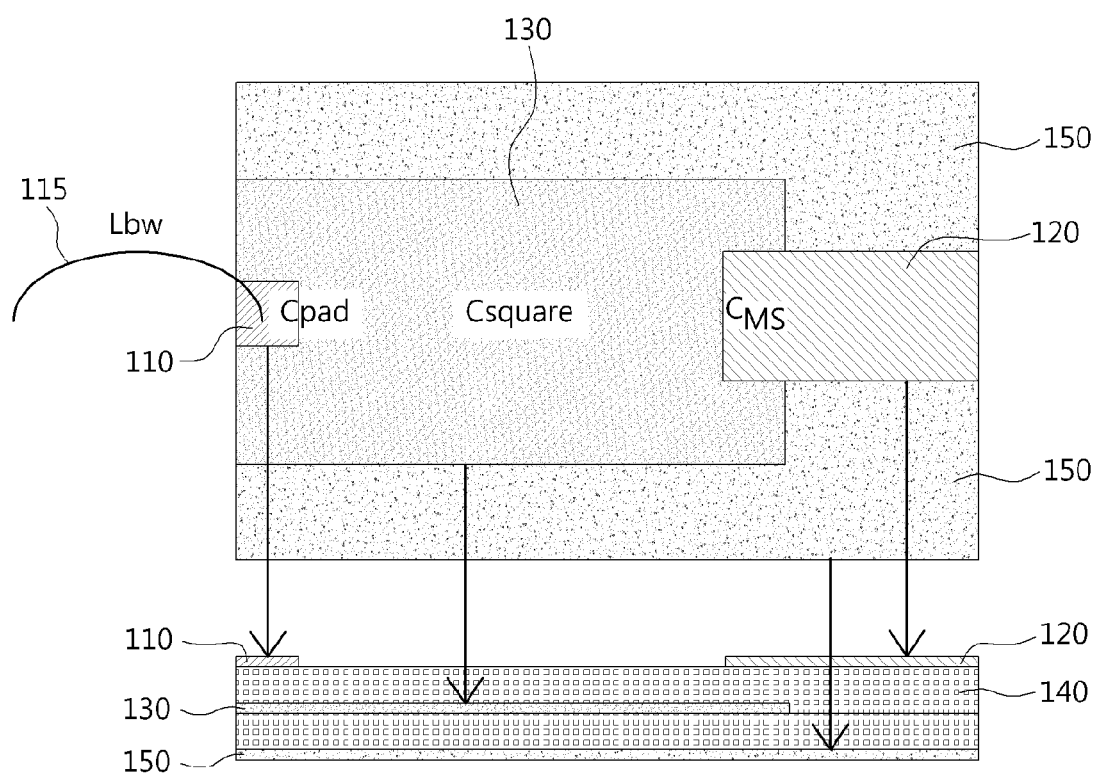
FIG. 1 is a plane view and side view illustrating a structure of an impedance matching circuit, according to an exemplary embodiment of the present disclosure.

Certain exemplary embodiments are described in higher detail below with reference to the accompanying drawings.

In the following description, like drawing reference numerals are used for the like elements, even in different drawings.

The matters defined in the description, such as detailed construction and elements, are provided to assist in a comprehensive understanding of exemplary embodiments. However, exemplary embodiments can be practiced without those specifically defined matters. Also, well-known functions or constructions are not described in detail since they would obscure the application with unnecessary detail.

FIG. 1 is a plane view and side view illustrating a structure of an impedance matching circuit 100, according to an exemplary embodiment of the present disclosure. As illustrated in FIG. 1, the impedance matching circuit 100 includes a first pad 110, transmission line 120, second pad 130, dielectric substrate 140, and its ground 150.

The first pad 110 is arranged on an upper surface of the dielectric substrate 140, and a bonding wire 110 is connected to the first pad 110. The bonding wire 115 connects a chip such as an antennae or transceiver etc. with another chip or a transmission line. In addition, the first pad 110 is a bonding pad which is an area connected to the bonding wire 115.

The transmission line 120 is arranged on an upper surface of the dielectric substrate 140, and an end is arranged by a certain distance from the first pad 110. The transmission line 120 is connected to another circuit or a chip and transmits a signal. One end of the transmission line 120 is distanced by a certain distance from the first pad 110, and the certain distance is $\lambda_g/4$.

Herein, $\lambda_g$ is a wavelength (wavelength where dielectric ratio of the dielectric is reflected) of a signal transmitted in the dielectric substrate 140. For example, in a case where a transmission signal is 60 GHz, $\lambda_g$ is 1-2 mm. More specifically, the impedance matching circuit 100 is produced on a substrate using an LTCC (Low-Temperature Confined Ceramic) method, and the transmission line 120 is a micro-strip line, and the line width may be 50 μm or more.

The second pad 130 is arranged inside the dielectric substrate 130, and is arranged to overlap with the first pad 110 and an end area of the transmission line 120. The second pad 130 is a conductor, and performs a function of a $\lambda_g/4$ transformer ($\lambda_g$ being a wavelength of the transmission line).

Herein, as illustrated in FIG. 1, the second pad 130 is arranged to be distanced by a certain distance up and low between the first pad 110 and one end area of the transmission line 120 and the dielectric substrate 140. In addition, the second pad 130 is arranged to be distanced by a certain distance from a ground 150 between the dielectric substrate 140. By such an arrangement, the second pad 130 performs a $\lambda_g/4$ transformer function.

More specifically, the area of the one end of the second pad 130 which overlaps with the first pad 110 area and transmission line 120 may be $\lambda_g/4$ long, and may have a square pad shape of $\lambda_g/4$ long. However, the shape of the second pad 130 is not limited thereto, and thus any pad may be used if only it is arranged in such a manner that it overlaps with the first pad 110 area and one end area of the transmission line 120.

As such, the second pad 130 generates a series capacitance with the first pad 100 area, generates a series capacitance with the area where it overlaps with the one end of the transmission line, and generates a parallel capacitance with the ground 150. In such a series capacitance component, the second pad 130 $\lambda_g/4$ long operates in $\lambda_g/4$ transformer, and in the first pad 110, the second pad 130 appears to be a parallel inductance. Through the aforementioned, the first pad 110, second pad 130, and one end of the transmission line 120 form an LC resonation circuit.

The dielectric substrate 140 becomes a basis for a circuit substrate where the impedance circuit 100 is arranged. As illustrated in FIG. 1, on the upper surface of the dielectric substrate 140, circuits are arranged, and especially the first pad 110 and transmission line 120 are arranged. In addition, inside (or in a mid layer) the dielectric substrate 140, the second pad 130 is arranged. Furthermore, on a lower surface of the dielectric substrate 140, the ground 150 is arranged.

The impedance matching circuit 100 of such a structure matches the impedance between the bonding wire 1150 connected to the first pad 110 and the transmission line 120, enabling transceiving signals of desired frequency with a minimum insertion loss, being applicable to various millimeter bands.

Figure 2A:
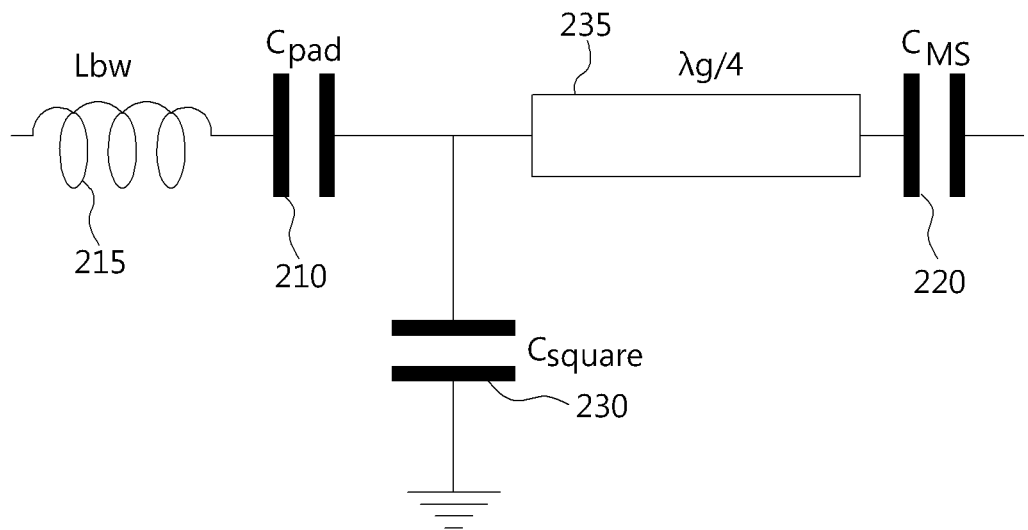
FIGS. 2A and 2B are views illustrating an equivalent circuit of the impedance matching circuit of FIG. 1, according to an exemplary embodiment of the present disclosure.
Figure 2B:
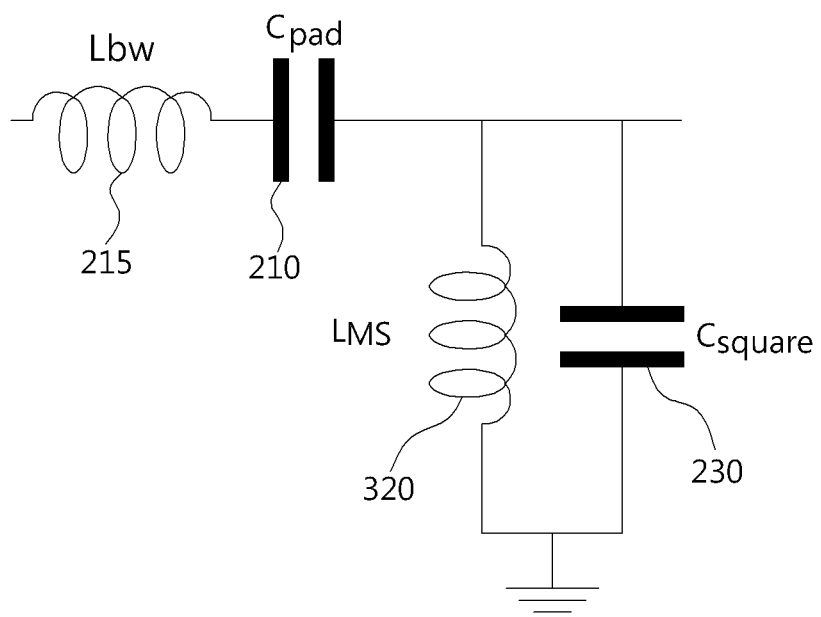

FIGS. 2A and 2B are views illustrating an equivalent circuit of the impedance matching circuit 100 of FIG. 1.

As illustrated in FIG. 2A, the impedance matching circuit 100 may be expressed as an equivalent circuit 200. The equivalent circuit 200 is formed by Cpad 210 which is a series capacitance by the first pad 110, $L_{bw}$ 215 which is an inductance by the bonding wire 115, a series capacitance $C_{MS}$ 220 by the transmission line 120, $C_{square}$ 230 which is a parallel capacitance by the second pad 130, and $\lambda_g/4$ transformer 235 by the second pad 130. In addition, as illustrated in FIG. 2B, $C_{MS}$ 220 and $\lambda_g/4$ transformer 235 are operated by the parallel inductance of $L_{MS}$ 320.

As such, according to the equivalent circuit 200, the first pad 110, second pad 130, and one end of the transmission line 120 form an LC resonation circuit.

Figure 3:
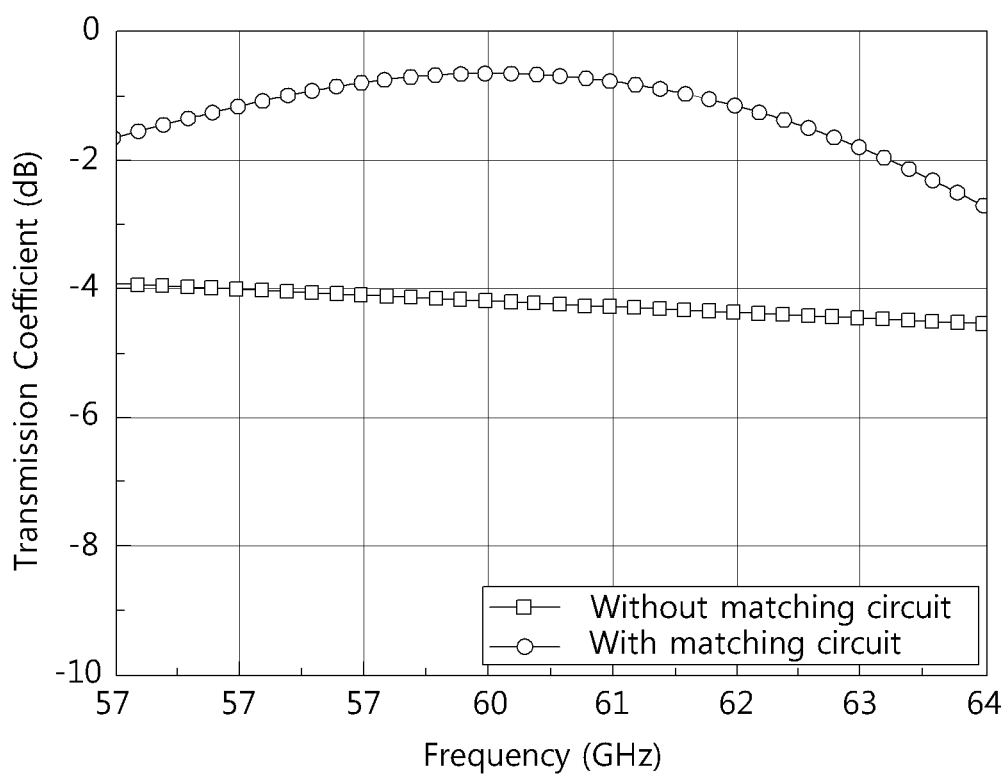
FIG. 3 is a simulation graph of a transmission loss in a case of applying an impedance matching circuit 100 and in a case of not applying the impedance matching circuit 100.

FIG. 3 is a simulation graph of a transmission loss in a case of applying an impedance matching circuit 100 and in a case of not applying the impedance matching circuit 100. FIG. 3 shows the transmission characteristics in a case of actually embodying the impedance matching circuit 100 according to an exemplary embodiment of the present disclosure. The frequency band has been designed to be 60 GHz, and the bonding wire 115 used is about 500 μm long.

As illustrated in FIG. 3, compared to when the impedance matching circuit 100 is not applied, when the impedance matching circuit 100 is applied, the transmission loss by the bonding wire 115 is perfectly corrected in the central frequency 60 GHz.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An impedance matching circuit, comprising:
   a dielectric substrate;
   a ground arranged on a lower surface of the dielectric substrate;
   a first pad which is arranged on an upper surface of the dielectric substrate, and to which bonding wires is connected;
   a transmission line which is arranged on the upper surface of the dielectric substrate, and of which an end is arranged by a certain distance from the first pad; and
   a second pad which is arranged inside the dielectric substrate, and is arranged to overlap with the first pad area and an end area of the transmission line,
   wherein the second pad is $\lambda_g/4$ transformer ($\lambda_g$ being a wavelength of a transmission signal).

2. The impedance matching circuit according to claim 1, wherein the transmission line is a micro-strip line, and has a line width of 50 μm or more.

3. The impedance matching circuit according to claim 1, wherein the impedance matching circuit is produced on a substrate using an LTCC (Low-Temperature Cofired Ceramic) method.

4. The impedance matching circuit according to claim 1, wherein a distance between the first pad area and the one end area of the transmission line is $\lambda_g/4$, and the area of the second pad overlapping with the first pad area and one end of the transmission line is $\lambda_g/4$.

5. The impedance matching circuit according to claim 4, wherein the second pad has a square pad shape of a length of $\lambda_g/4$.

6. An impedance matching circuit, comprising:
   a dielectric substrate;
   a ground arranged on a lower surface of the dielectric substrate;
   a first pad which is arranged on an upper surface of the dielectric substrate, and to which bonding wires is connected;
   a transmission line which is arranged on the upper surface of the dielectric substrate, and of which an end is arranged by a certain distance from the first pad; and
   a second pad which is arranged inside the dielectric substrate, and is arranged to overlap with the first pad area and an end area of the transmission line,
   wherein the second pad generates a series capacitance component with the first pad, generates a parallel capacitance component with the ground, and generates a series capacitance component with an end of the transmission line.

7. The impedance matching circuit according to claim 6, wherein the first pad, second pad, and the end of the transmission line form an LC resonation circuit.

* * * * *